United States Patent
Bernaski et al.

(10) Patent No.: US 8,349,086 B2
(45) Date of Patent: Jan. 8, 2013

(54) NON-STICK MASKING FIXTURES AND METHODS OF PREPARING SAME

(75) Inventors: Ryan Richard Bernaski, Marlborough, MA (US); Bartolomeo Palmieri, Guilford, CT (US)

(73) Assignee: United Technologies Corporation, Hartford, CT (US)

( * ) Notice: Subject to any disclaimer, the term of this patent is extended or adjusted under 35 U.S.C. 154(b) by 1053 days.

(21) Appl. No.: 10/903,321

(22) Filed: Jul. 30, 2004

(65) Prior Publication Data

US 2006/0021579 A1 Feb. 2, 2006

(51) Int. Cl.
 *C23C 16/04* (2006.01)
 *C23C 16/00* (2006.01)

(52) U.S. Cl. .................. 118/721; 118/715; 118/720

(58) Field of Classification Search .......... 118/720, 118/721, 504, 505, 715
See application file for complete search history.

(56) References Cited

U.S. PATENT DOCUMENTS

| | | | |
|---|---|---|---|
| 3,647,730 A | | 3/1972 | Rott et al. |
| 4,603,056 A | | 7/1986 | MacKinnon et al. |
| 5,102,498 A | * | 4/1992 | Itoh et al. ................ 216/47 |
| 5,534,072 A | * | 7/1996 | Mizuno et al. ........... 118/728 |
| 5,565,035 A | * | 10/1996 | Sylvestro et al. ........ 118/721 |
| 5,642,641 A | * | 7/1997 | Maxfield et al. ......... 72/358 |
| 5,658,470 A | * | 8/1997 | Schultz et al. ........... 216/22 |
| 5,751,101 A | * | 5/1998 | Takanobu et al. ........ 313/405 |
| 5,792,267 A | | 8/1998 | Marszal et al. |
| 5,803,971 A | | 9/1998 | Menchetti et al. |
| 5,879,753 A | | 3/1999 | Zajchowski et al. |
| 5,891,267 A | * | 4/1999 | Schaeffer et al. ........ 148/206 |
| 5,919,332 A | * | 7/1999 | Koshiishi et al. ........ 156/345.47 |
| 6,224,673 B1 | | 5/2001 | Das et al. |
| 6,296,705 B1 | | 10/2001 | Ireland et al. |
| 6,391,115 B1 | | 5/2002 | Marszal et al. |
| 6,403,157 B2 | | 6/2002 | Ireland et al. |
| 6,579,567 B1 | | 6/2003 | Das et al. |
| 6,764,555 B2 | * | 7/2004 | Hiramatsu et al. ....... 148/325 |
| 2001/0029665 A1 | * | 10/2001 | Hashimoto et al. ...... 29/846 |

(Continued)

FOREIGN PATENT DOCUMENTS

JP 56-140353 * 11/1981

(Continued)

OTHER PUBLICATIONS

Hardness Conversion Table; http://www.gordonengland.co.uk/hardness/hardness_conversion_2m.htm.* Transionlation of JP 11-042867 A.*
European Search Report dated Nov. 18, 2005.

*Primary Examiner* — Jeffrie R Lund
(74) *Attorney, Agent, or Firm* — Bachman & LaPointe, P.C.

(57) ABSTRACT

Non-stick fixtures for selectively masking portions of a workpiece during application of a workpiece coating are described herein. These fixtures have predetermined surfaces thereon having an average surface roughness of about 25 Ra or less and a Rockwell hardness of about 65 Rc or more. The controlled average surface roughness ensures that these fixtures are non-stick with respect to the workpiece coating being applied to the workpieces disposed therein. The controlled Rockwell hardness ensures that the desired average surface roughness can be maintained throughout repeated use of the fixture in harsh coating environments. These fixtures reduce the workpiece coating bridging that occurs between the fixture and the workpiece, and also reduce the amount of overspray that occurs on the workpiece, thereby minimizing the amount of handwork and/or rework that is necessary after the workpiece is coated. This improves process cycle times and yields significantly.

10 Claims, 1 Drawing Sheet

U.S. PATENT DOCUMENTS

| | | | |
|---|---|---|---|
| 2002/0102178 A1* | 8/2002 | Hiramatsu et al. | 420/46 |
| 2003/0185976 A1 | 10/2003 | Villarreal et al. | |
| 2004/0005409 A1 | 1/2004 | Das et al. | |
| 2004/0109735 A1* | 6/2004 | Arvin et al. | 409/12 |
| 2004/0116242 A1* | 6/2004 | Uchiyama et al. | 476/46 |
| 2006/0021579 A1* | 2/2006 | Bernaski et al. | 118/720 |
| 2006/0163073 A1* | 7/2006 | Higashihara et al. | 205/70 |
| 2006/0194367 A1* | 8/2006 | Tanida et al. | 438/108 |

FOREIGN PATENT DOCUMENTS

| | | | |
|---|---|---|---|
| JP | 61084366 A | | 4/1986 |
| JP | 11-042867 | * | 7/1997 |
| JP | 2000-340926 | * | 12/2000 |
| JP | 2004167713 A1 | | 6/2004 |
| WO | WO 02/099532 A | | 12/2002 |

* cited by examiner

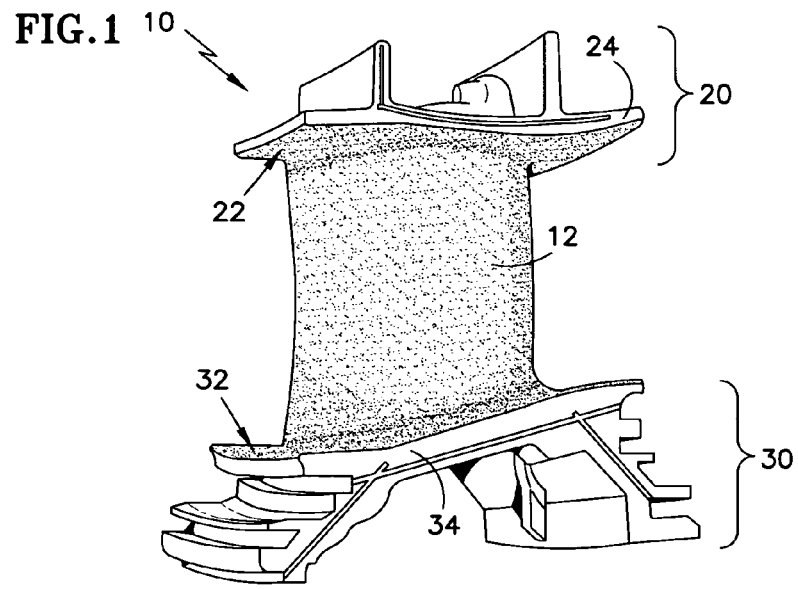
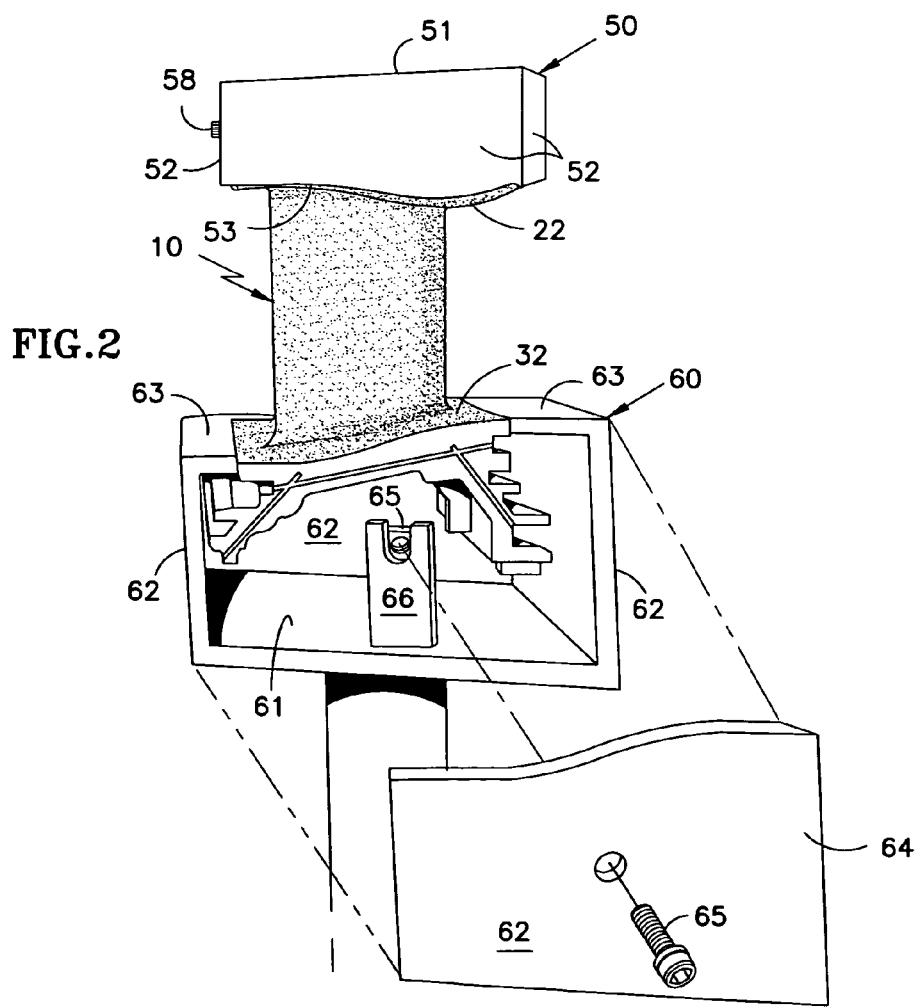

NON-STICK MASKING FIXTURES AND METHODS OF PREPARING SAME

FIELD OF THE INVENTION

The present invention relates generally to masking fixtures. More specifically, the present invention relates to non-stick fixtures that are useful for masking selected portions of a workpiece during application of a workpiece coating thereon, and methods of preparing fixtures for such purposes.

BACKGROUND OF THE INVENTION

Gas turbine engines have long been used to convert chemical potential energy, in the form of fuel, to thermal energy, and then to mechanical energy for use in propelling aircraft, generating electric power, pumping fluids, etc. The efficiency of gas turbine engines increases with increasing operating temperatures. Therefore, there is a large incentive to raise the combustion and exhaust gas temperatures of such engines. However, the metallic materials currently used in the hot-section components of such engines operate at temperatures very near the upper limits of their thermal stability. In fact, in the hottest sections of modern gas turbine engines, metallic materials are utilized in hot gas paths at temperatures above their melting points. These metallic materials survive such temperatures only because they are air cooled, or because they comprise ceramic coatings thereon that lower the thermal conductivity of the component, thereby allowing the components to be operated at higher temperatures while utilizing less cooling air. Such ceramic coatings may additionally or alternatively provide environmental protection to the metallic components, protecting the components against the oxidative and corrosive effects of the hot gases passing therethrough or thereby.

During engine operation, the airfoil and inner buttress surfaces of the turbine vanes are directly exposed to the hot gases, and are therefore susceptible to accelerated oxidation and corrosion. Accordingly, a ceramic coating is generally applied to the airfoil and inner buttress surfaces of these vanes. In contrast, the remaining surfaces of these vanes are not directly exposed to the hot gases, and coating these remaining surfaces may actually be detrimental and degrade the fatigue life of the attachment mechanisms and other highly stressed regions thereof. Therefore, these remaining surfaces are typically left uncoated.

Fixtures are often used to mask the selected portions of the vane that are not being coated. However, with such fixtures, bridging of the ceramic coating being applied to the vane often occurs between the vane and the fixture itself. This bridging may cause some of the ceramic coating to chip away from the vane, or cause extra ceramic coating to adhere to the vane, when the vane is removed from the fixture. Both cases require a significant amount of handwork and/or rework in order to prepare the vane for use in a gas turbine engine.

It would be desirable to have fixtures for selectively masking turbine vanes or other workpieces prior to coating unmasked portions thereof. It would be further desirable to have fixtures that allowed such workpieces to be coated without bridging of the workpiece coating occurring between the fixture and the workpiece during application of a workpiece coating. It would be particularly desirable to have such fixtures be non-stick with respect to the workpiece coating being deposited on the workpiece so that less handwork and/or rework than currently required would be necessary.

SUMMARY OF THE INVENTION

Accordingly, the above-identified shortcomings of existing masking fixtures are overcome by embodiments of the present invention, which relates to masking fixtures that are non-stick with respect to the workpiece coating being deposited on a workpiece disposed therein so that workpiece coating bridging is less likely to occur between the fixture and the workpiece, thereby minimizing the amount of handwork and/or rework that is necessary after the workpiece is coated. These fixtures utilize controlled average surface roughnesses to ensure that the workpiece coating does not adhere to the fixtures, and controlled Rockwell hardnesses to ensure that the fixtures can maintain those desired surface roughnesses throughout time in the harsh, abrasive coating environments in which they are used.

Embodiments of this invention comprise fixtures for selectively masking a workpiece disposed therein, the fixture being hard enough to maintain an average surface roughness of about 25 Ra or less on predetermined surfaces of the fixture throughout repeated applications of a workpiece coating on different workpieces disposed therein.

Embodiments of this invention also comprise fixtures for selectively masking a workpiece disposed therein, wherein predetermined surfaces of the fixture have an average surface roughness of about 25 Ra or less and a Rockwell hardness of about 65 Rc or more.

Embodiments of this invention also comprise methods for preparing a fixture for selectively masking a workpiece during application of a workpiece coating. These methods comprise the steps of: preparing predetermined surfaces of the fixture to an average surface roughness of about 25 Ra or less; and ensuring that the predetermined surfaces are hard enough to maintain the average surface roughness throughout repeated applications of workpiece coating. The preparing step may comprise polishing the predetermined surfaces. The ensuring step may comprise: (a) making at least the predetermined surfaces of the fixture from a material having a Rockwell hardness of at least about 65 Rc; (b) coating at least the predetermined surfaces of the fixture with a fixture coating to harden at least the predetermined surfaces of the fixture to a Rockwell hardness of at least about 65 Rc; and/or (c) treating at least the predetermined surfaces of the fixture to harden at least the predetermined surfaces of the fixture to a Rockwell hardness of at least about 65 Rc. The coating step may comprise applying the fixture coating via physical vapor deposition, chemical vapor deposition, or any other suitable fixture coating process. The treating step may comprise hardening at least the predetermined surfaces of the fixture via a nitriding process, a plating process, or any other suitable surface treatment process. The fixture coating may comprise TiN, TiAlN, or any other suitable material.

The predetermined surfaces may comprise at least a portion of any fixture surfaces where bridging of workpiece coating may occur between the fixture and the workpiece. The predetermined surfaces may comprise at least any fixture surfaces that will be exposed to workpiece coating when the workpiece is being coated. These fixtures should be capable of being used in a thermal spray process. These fixtures may be made of A2 tool steel at least partially coated with TiN or TiAlN. The workpiece may comprise a gas turbine engine component.

Further features, aspects and advantages of the present invention will be readily apparent to those skilled in the art during the course of the following description, wherein references are made to the accompanying figures which illustrate some preferred forms of the present invention, and wherein like characters of reference designate like parts throughout the drawings.

DESCRIPTION OF THE DRAWINGS

The systems and methods of the present invention are described herein below with reference to various figures, in which:

FIG. 1 is a schematic diagram showing a turbine vane, as coated in an exemplary masking fixture of this invention; and FIG. 2 is an exploded view showing the turbine vane of FIG. 1 partially enclosed in an exemplary masking fixture of this invention.

DETAILED DESCRIPTION OF THE INVENTION

For the purposes of promoting an understanding of the invention, reference will now be made to some preferred embodiments of this invention as illustrated in FIGS. 1-2 and specific language used to describe the same. The terminology used herein is for the purpose of description, not limitation. Specific structural and functional details disclosed herein are not to be interpreted as limiting, but merely as a basis for the claims as a representative basis for teaching one skilled in the art to variously employ the present invention. Any modifications or variations in the depicted structures and methods, and such further applications of the principles of the invention as illustrated herein, as would normally occur to one skilled in the art, are considered to be within the spirit and scope of this invention.

This invention relates to fixtures that are useful for masking selected portions of a workpiece during application of a workpiece coating thereon, and methods of preparing fixtures for such purposes. These fixtures utilize controlled average surface roughnesses to make the fixtures non-stick with respect to the workpiece coatings being applied to workpieces disposed therein, making it less likely that bridging of the workpiece coating will occur between the fixture and the workpiece, and minimizing the amount of handwork and/or rework that is required after the workpiece is coated. These fixtures also utilize controlled Rockwell hardnesses to ensure that the fixtures can maintain the desired surface roughnesses in the harsh coating environments in which they are used.

Referring now to FIG. 1, there is shown a schematic diagram of a turbine vane 10, as coated in an exemplary non-stick masking fixture of this invention. This exemplary turbine vane 10 comprises an airfoil 12, an inner buttress 20 having an inner surface 22 and a mate face 24, and an outer buttress 30 having an inner surface 32 and a mate face 34.

Typically, only the airfoil 12 and the inner surfaces 22, 32 are coated (i.e., with 7YSZ), while the other surfaces of the turbine vane remain uncoated. The portions of the vane that do not need coating (i.e., mate faces 24, 34, etc.) are generally selectively masked before being placed in a coating apparatus. This may be accomplished by using a masking fixture. As previously noted, existing masking fixtures are less than optimal. However, the fixtures of this invention provide a cost effective, labor saving means for masking selected portions of a turbine vane during coating thereof. The nonstick masking fixtures of this invention significantly reduce the time it takes to process a turbine vane by reducing the amount of handwork and/or rework that is necessary to prepare the vanes for use in a gas turbine engine.

The non-stick masking fixtures of this invention may comprise any suitable shape or format, so long as the fixture adequately prevents selected portions of the vane 10 or other workpiece disposed therein from being coated. In one exemplary embodiment, the fixture may comprise two parts: a top fixture 50 and a bottom fixture 60, as shown in FIG. 2.

The top fixture 50 may comprise a conventional, metallic coating box having an end plate 51 and four walls 52 extending therefrom to form a five-sided enclosure with a partially open end 53 opposite the end plate 51. The partially open end 53 may comprise an aperture therein designed to fit substantially flush at its outer surface with the inner surface 22 of the inner buttress 20. Once the inner buttress 20 of the vane 10 is inserted into the top fixture 50, the top fixture 50 may be secured in place in any suitable manner, such as, for example, via a set screw 58.

The bottom fixture 60 may also comprise a conventional, metallic coating box having an end plate 61 and four walls 62 extending therefrom to form a five-sided enclosure with a partially open end 63 opposite the end plate 61. The partially open end 63 may comprise an aperture therein designed to fit substantially flush at its outer surface with the inner surface 32 of the outer buttress 30. In embodiments, the bottom fixture 60 may comprise a removable portion 64 that can be removed from the bottom fixture 60 to enable easier insertion of the outer buttress 30 of the vane 10 into the bottom fixture 60. Once the outer buttress 30 of the vane 10 is inserted into the bottom fixture 60, the removable portion 64 can be replaced and secured in place in any suitable manner, such as, for example, via a nut and bolt 65 and an anchoring device 66.

In embodiments, predetermined surfaces on the fixtures of this invention have an average surface roughness of about 25 Ra or less and a Rockwell hardness of at least about 65-85 Rc or more. The relatively smooth surfaces minimize the amount of workpiece coating that will adhere to and build up on the fixture during coating of the workpiece disposed therein, and the hardness ensures that the desired surface roughness/smoothness can be maintained throughout repeated use of the fixture in a workpiece coating environment. Since these fixtures are non-stick with respect to the workpiece coating, they prevent, or at least minimize, bridging of the workpiece coating between the fixture and the workpiece.

These predetermined surfaces comprise at least portions of the surfaces where bridging of the workpiece coating may occur between the fixture and the workpiece. In the embodiment shown, that includes at least those portions of the partially open ends 53, 63 that are closest to the vane 10 disposed therein. Controlling the average surface roughness and Rockwell hardness of these predetermined surfaces makes it less likely that bridging of the workpiece coating will occur between the fixture and the workpiece disposed therein. Some or all of the other exterior surfaces (i.e., those surfaces that may be exposed to workpiece coating when the workpiece is being coated—walls 52, 62, end plates 51, 61, etc.) may also have their average surface roughnesses and Rockwell hardnesses controlled to make more of the fixture non-stick with respect to the workpiece coating. Even the interior surfaces of the fixtures could have their surface roughnesses and hardnesses controlled, if desired. However, it is most important to control the surfaces where bridging of the workpiece coating may occur.

In some embodiments, only the exterior surfaces of the partially open ends 53, 63 have their surface roughnesses and hardnesses controlled. In other embodiments, the exterior surfaces of the partially open ends 53, 63, as well as the exterior surfaces of the walls 52, 62 have their surface roughnesses and hardnesses controlled. In yet other embodiments, all exterior surfaces of the fixture that may be exposed to workpiece coating have their surface roughnesses and hardnesses controlled. Many other embodiments are also possible, and all are within the spirit and scope of this invention.

The predetermined surfaces of the fixture can be prepared to an average surface roughness of about 25 Ra or less in various ways, such as by manually polishing the surfaces with an abrasive wheel, flap wheel or sandpaper, or in any other suitable manner.

Once the desired average surface roughness is achieved, a Rockwell hardness of about 65-85 Rc or more on at least the predetermined surfaces can be achieved in various ways. If the predetermined surfaces of the fixture have a Rockwell hardness of about 65 Rc, they will work well, they just won't likely last as long as surfaces with a Rockwell hardness of closer to 80-85 Rc. In embodiments, the desired hardness can be achieved by applying a fixture coating to the predetermined surfaces of the fixture. In other embodiments, the desired hardness can be achieved by treating the predetermined surfaces of the fixture. In yet other embodiments, the desired hardness can be achieved by making the fixture out of a material that has a Rockwell hardness of about 65 Rc or more, so that no fixture coating or surface treatment is necessary to harden the fixture surfaces. As previously noted, controlling the hardness of at least the predetermined surfaces of the fixture ensures that the desired surface roughnesses can be maintained throughout repeated use of the fixtures, thereby maintaining the non-stick properties of the fixture.

A fixture coating may be applied to at least the predetermined surfaces of the fixture to harden those surfaces to a Rockwell hardness of about 65-85 Rc or more. When using fixture coating, the fixture itself may be made of any suitable material that is hard enough to provide structural support to the fixture coating so that the fixture coating will not be susceptible to cracking, chipping, or other premature failures. In embodiments, these fixtures may be made of a hardened tool steel such as A2 tool steel. Preferably, the uncoated fixture material will have a minimum Rockwell hardness of about 45 Rc. The fixture coating may comprise any suitable material that will harden the fixture surfaces enough to maintain the desired surface roughness thereon. In embodiments, the fixture coating comprises TiN or TiAlN. The fixture coating may be of any suitable thickness, and in embodiments, is about 3-5 microns thick. This fixture coating may be applied in any suitable manner, such as, for example, physical vapor deposition (PVD) or chemical vapor deposition (CVD).

The hardness of the predetermined surfaces on the fixture, and the hardness of the underlying material that the fixture itself is made from, are both important. When applying a fixture coating, it is best to apply it to the hardest possible surface to maximize the life of the fixture.

Surface treatments may also be used to harden at least the predetermined surfaces of the fixture to a Rockwell hardness of about 65 Rc or more. When using surface treatments, the fixture itself may be made of any suitable material that is hard enough to be hardened to a Rockwell hardness of about 65 Rc or more with surface treatments. In embodiments, these fixtures may be made of a hardened tool steel such as A2 tool steel, or any other material that has a minimum Rockwell hardness of about 45 Rc. Such surface treatments may comprise nitriding and/or plating.

To use the fixtures of this invention, an uncoated workpiece is mounted in the fixture so that selected portions of the workpiece are masked by the fixture. When the workpiece coating is applied, the portion of the workpiece within the fixture will remain substantially uncoated.

Existing fixtures often require large gaps (sometimes as wide as about 0.060 inches) to be maintained between the fixture and the workpiece disposed therein so that bridging of the workpiece coating is less likely to occur. These large gaps, however, allow significant amounts of overspray to accumulate on portions of the workpiece that are to remain uncoated (i.e., on mate surfaces 24, 34). Some eliminate this overspray by taping these uncoated surfaces of the workpiece with high temperature tape prior to inserting the workpiece into the fixture. Others eliminate this overspray by handworking (i.e., via an abrasive wheel, hand grinder, etc.) the workpieces to remove the overspray from the coated workpieces as necessary. However, such handworking often creates further chipping and blending problems, which then requires further reworking (i.e., stripping the workpiece coating from the workpiece and then recoating the workpiece). Both these fixes to the overspray problem are manual labor intensive, and increase cycle time for the workpieces.

In contrast to existing fixtures, the fixtures of this invention allow much smaller gaps (about 0.020 inches) to be maintained between the fixture and the workpiece disposed therein. This prevents or substantially minimizes the overspray that occurs on the workpieces being coated, thereby significantly reducing the amount of handwork and/or rework that must be done to a coated workpiece before it can be used for its intended purpose. This also improves the yields, increases the throughput, and decreases the cycle time for workpieces that are coated in the fixtures of this invention.

This invention also comprises methods for preparing fixtures for use in any suitable workpiece coating process, such as, for example, thermal spray processes such as air plasma spray (APS). First, any surfaces that may allow bridging of the workpiece coating to occur between the fixture and the workpiece disposed therein should be prepared to an average surface roughness of about 25 Ra or less. Additional fixture surfaces, or even all the fixture surfaces, may be prepared to this average surface roughness, if desired. Thereafter, the critical surfaces of the fixture should be hardened to a Rockwell hardness of at least about 65 Rc, more preferably about 80-85 Rc. This hardness may be established on as many of the fixture surfaces as desired, and may even include all fixture surfaces. The critical surfaces include at least portions of any surfaces that may allow bridging of the workpiece coating to occur between the fixture and the workpiece disposed therein. Preparing and hardening the surfaces in this manner allows the desired surface roughness to be maintained in the harsh workpiece coating environments in which the fixtures are used.

Several sample masking fixtures were created and tested in a thermal spray environment. These fixtures were made of 340 stainless steel in a first embodiment, and A2 tool steel in a second embodiment. Predetermined surfaces of the fixtures (i.e., the partially open ends 53, 63 and portions of the walls 52, 62) were prepared to an average surface roughness of about 25 Ra or less by buffing and polishing. Thereafter, a fixture coating comprising TiN was deposited on the 340 stainless steel and the A2 tool steel via PVD in vacuum at about 850° F. for about 1.5 hours. These fixture coatings were about 3-5 microns thick. After the fixture coating was applied, the predetermined surfaces on both of these fixtures had a Rockwell hardness of about 83 Rc. These fixtures were used to mask selected portions of turbine vanes during air plasma spray of a 7YSZ workpiece coating thereon. These fixtures showed significant improvements over existing fixtures by substantially reducing the amount of overspray that occurred on the vanes, and virtually eliminating the bridging of the workpiece coating between the vane and the fixture. This, in turn, substantially reduced the amount of handwork and rework that was required to prepare these vanes for use in a gas turbine engine. Furthermore, these fixtures were used for approximately 250 cycles, and were still performing well. This represents a substantial improvement in useful life compared to existing fixtures.

As described above, this invention provides fixtures for use in masking selected portions of workpieces so that workpiece coating is deposited only on certain surfaces thereof. Advantageously, these fixtures minimize the amount of workpiece coating bridging that will occur between a fixture and a workpiece disposed therein. Additionally, these fixtures minimize the amount of overspray that occurs on the workpiece. Therefore, the amount of handwork and/or rework that is necessary on the coated workpieces is significantly reduced. This in turn improves process yields and decreases cycle times. These fixtures are also much more durable than existing fixtures. All these advantages make the fixtures of this invention very desirable. Many other advantages will be apparent to those skilled in the relevant art.

Various embodiments of this invention have been described in fulfillment of the various needs that the invention meets. It should be recognized that these embodiments are merely illustrative of the principles of various embodiments of the present invention. Numerous modifications and adaptations thereof will be apparent to those skilled in the art without departing from the spirit and scope of the present invention. For example, while embodiments described herein relate to fixtures for selectively masking and coating turbine vanes, these fixtures may be easily adapted for use in masking and coating many other gas turbine engine components (i.e., blade outer air seals, etc.) and/or components for numerous other applications. This invention is not limited to fixtures for masking and coating gas turbine engine components. These fixtures may be used in any suitable coating process for the application of any workpiece coating that is primarily mechanically bonded to the workpiece. Thus, it is intended that the present invention cover all suitable modifications and variations as come within the scope of the appended claims and their equivalents.

What is claimed is:

1. A fixture for selectively masking portions of a gas turbine engine component disposed therein while a workpiece coating is being applied to unmasked portions thereof, predetermined surfaces of the fixture comprising:
   an average surface roughness of about 25 Ra or less to minimize the amount of workpiece coating bridging that will occur between the fixture and the gas turbine engine component when the workpiece coating is applied; and
   a Rockwell hardness of about 65 Rc or more to ensure the fixture can maintain an average surface roughness of about 25 Ra or less throughout repeated applications of the workpiece coating,
where the predetermined surfaces include at least portions of the surfaces of the fixture proximate the gas turbine engine component where workpiece coating bridging might occur across a gap in a plasma spray coating proceess that is configured to minimize the amount of rework needed on the gas turbine engine component after the gas turbine engine component is coated, and the fixture and the gas turbine engine component disposed therein define the gap that is as small as about 0.020 inches.

2. The fixture of claim 1, wherein the predetermined surfaces comprise at least any fixture surfaces that will be exposed to workpiece coating when the gas turbine engine component is being coated.

3. The fixture of claim 1, wherein the fixture is capable of being used in a thermal spray process.

4. The fixture of claim 1, wherein the fixture is made of A2 tool steel at least partially coated with TiN or TiAlN.

5. The fixture of claim 1, wherein the predetermined surfaces of the fixture comprise at least one of the following:
   (a) an uncoated material having a Rockwell hardness of at least about 65 Rc;
   (b) a fixture coating on the surfaces, the coating comprising a Rockwell hardness of at least about 65 Rc; and
   (c) a treated material that has been treated to have a Rockwell hardness of at least about 65 Rc.

6. The fixture of claim 5, wherein the predetermined surfaces have been polished to an average surface roughness of about 25 Ra or less.

7. The fixture of claim 5, wherein the fixture is made of at least one of: A2 tool steel and 340 stainless steel.

8. The fixture of claim 5, wherein the fixture coating comprises at least one of TiN and TiAlN.

9. The fixture of claim 5, wherein the treated material has been treated via at least one of a nitriding process and a plating process.

10. The fixture of claim 1, wherein the plasma spray coating process is a YSZ plasma spray coating process.

* * * * *